US006934187B2

(12) United States Patent
Cheung

(10) Patent No.: US 6,934,187 B2
(45) Date of Patent: *Aug. 23, 2005

(54) PROGRAMMABLE SOFT-START CONTROL FOR CHARGE PUMP

(75) Inventor: Paul Cheung, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/868,306

(22) Filed: Jun. 15, 2004

(65) Prior Publication Data

US 2004/0228189 A1 Nov. 18, 2004

Related U.S. Application Data

(63) Continuation of application No. 09/809,441, filed on Mar. 15, 2001, now Pat. No. 6,785,180.

(51) Int. Cl.[7] .............................................. G11C 16/04
(52) U.S. Cl. .................... 365/185.18; 365/204
(58) Field of Search ....................... 365/185.33, 189.09, 365/233, 204, 185.18

(56) References Cited

U.S. PATENT DOCUMENTS

| 4,625,271 A | 11/1986 | Chetty et al. |
| 5,461,301 A | 10/1995 | Truong |
| 5,479,090 A | 12/1995 | Schultz |
| 5,532,645 A | 7/1996 | Fagnani et al. |
| 5,625,279 A | 4/1997 | Rice et al. |
| 5,943,203 A * | 8/1999 | Wang .......................... 361/75 |
| 5,949,665 A | 9/1999 | Seong |
| 6,198,258 B1 | 3/2001 | Ando et al. |
| 6,304,039 B1 | 10/2001 | Appelberg et al. |
| 6,785,180 B2 * | 8/2004 | Cheung ....................... 365/204 |

OTHER PUBLICATIONS

Obalit Khorshid; Selecting Change–Pump DC/DC Converters; Aug. 17, 2000; 5 pages.

* cited by examiner

Primary Examiner—Thong Q. Le
(74) Attorney, Agent, or Firm—Dinsmore & Shohl LLP

(57) ABSTRACT

A programmable soft-start control circuit having two memory registers for regulating the ramp-up time period of charging current in a charge pump of an integrated circuit. The two memory registers are programmed to provide two different soft-start settings for two distinct charge pump turn-on conditions, initial power-up and flash programming. Charge pump feedback logic is employed to detect the charge pump turn-on condition and activate the proper pre-programmed soft-start setting loaded in the memory registers.

32 Claims, 2 Drawing Sheets

PROGRAMMABLE SOFT-START CONTROL FOR CHARGE PUMP

CROSS REFERENCE TO RELATED APPLICATIONS

This application is a continuation of U.S. patent application Ser. No. 09/809,441, filed Mar. 15, 2001 now U.S. Pat. No. 6,785,180.

BACKGROUND OF THE INVENTION

The present invention relates to integrated circuits, and more particularly to a programmable soft-start control for a charge pump in a semiconductor-integrated circuit.

Flash memory cards have a range of voltage requirements in order to drive the integral flash-memory devices, controllers, and analog circuits. A charge pump is a typical power-supply circuit that is capable of providing for these voltage requirements through voltage conversion.

In systems that use flash memory cards, as such a card is hot-plugged, it is desirable to extend the time period to fully power the card in order to control the high inrush or surge current at turn on. If the current is not controlled, damage may be done to the card's connectors and components. Additionally, the power supply circuit breaker may also trip resulting in a shutdown of the whole system. Accordingly, a soft-start is performed by controlling the ramp-up rate of the applied voltage(s) in order to provide a relatively constant current to the card's load capacitance while it is charging. Inrush current limiting is also beneficial because dv/dt control reduces both the EMI due to current and voltage spikes, and the stress on capacitors and the semiconductor devices surrounding the circuitry.

For flash memory cards, embedded charge pumps provide several amps to an array of flash memory devices and typically control the voltage ramp-up rate with a timing capacitor. However, because these circuits use timing capacitors, such circuits lack the ability to adjust for finer soft-start control and the ability to quickly program specific soft-start settings according to desired pump turn-on conditions.

Therefore, there is a need for a programmable soft-start control in a charge pump circuit that allows for finer soft-start control via firmware and that adds flexibility to applying specific soft-start settings according to charge pump turn-on conditions.

SUMMARY OF THE INVENTION

The above-mentioned need is met by providing a programmable soft-start control for a charge pump according to the present invention. Clocked pulse-frequency modulation (PFM) is used to control the charge and discharge phase. The soft-start control provides digital logic which breaks up the hard voltage ramp-up of the charge pump's output voltage into a series of discrete voltage ramp-up steps. Preferably, the soft start control provides a charging-series of seven voltage ramp-up rate steps, in which the frequency of these steps can be preprogrammed via an 8-bit register. Since the charge pump is turned on at least in two conditions, during initial powering or flash programming, each of the two registers can be programmed to provide a desired frequency of the charging-series of voltage ramp-up rate steps for one of the two conditions. Detection logic is provided to detect which of the two conditions is present and thus, the soft-start control automatically switches over to the proper pre-programmed frequency for the charging-series of voltage ramp-up rate steps.

In one embodiment of the present invention, provided is a programmable soft-start control for a charge pump. The charge pump provides a voltage output, a charge-off signal output when the voltage output is below a target voltage, charge-strength selector inputs which set a voltage ramp-up rate of the voltage output by controlling the strength of the charging transistor, a clock input (PCLK) which controls the charge and discharge phase, and a PUMPON signal input which controls the turn on of the pump circuit. The soft-start control comprises a charging-series circuit coupled to the charge-off signal output and the charge-strength selector inputs of the charge pump. The charging-series circuit is adapted to provide a charging-series output to the charge-strength selector inputs. The soft start control further includes at least one frequency selector circuit providing a clock pulse output that is used by the charging-series circuit for a specific soft-start condition of the charge pump. The at least one frequency selector circuit can be programmed to select a frequency of the clock pulse output.

In another embodiment of the present invention, provided is a method for controlling a voltage ramp-up rate of a charge pump providing an output voltage under specific soft-start conditions, the charge pump having charge-strength selector inputs which in conjunction with a PFM clock input set a voltage ramp-up rate of the output voltage. The method comprises programming at least one memory register to set both a divisor for a divide-by-n counter/prescaler and a clock signal input for a specific soft-start condition of the charge pump, and producing a clock signal pulse of a specific frequency based on digital logic stored in the at least one memory register. The method further includes driving a charging-series output with the clock signal pulse at the specific frequency, and providing the charging-series output to the charge-strength selector inputs of the charge pump to vary the voltage ramp-up rate of the output voltage of the charge pump for each of the specific soft-start condition.

In still another embodiment of the present invention, provided is a programmable soft-start control for use with an external circuit. The soft-start control comprises a pair of frequency selector circuits each having programmable non-volatile memory, a multiplexer adapted to receive clock signal inputs from the external circuit and having selection inputs and a selected output, a counter having data inputs for setting a frequency of a clock pulse output, and a gate circuit. Each of the data inputs of the counter and each of the selection inputs of the multiplexer are coupled to a separate bit register of the memory. The selected output of the multiplexer is coupled both to a clock input of the counter and a clock input of the gate. A charging-series circuit includes a bit counter providing a series of outputs. The soft-start control further comprises a detection and selection circuit having a multiplexer and a flip-flop circuit. The multiplexer is coupled to the gate of each of the pair of frequency selector circuits such that the multiplexer provides the clock pulse output of the counter to clock the bit counter of the charging-series circuit. The flip-flop sets which one of the pair of frequency selector circuits provides the clock pulse output to the charging-series circuit based on input from the external circuit.

In yet another embodiment of the present invention, provided is an apparatus comprising a flash memory, and a charge pump. The charge pump provides a voltage output to the flash memory, a charge-off signal output when the voltage output is below a target voltage for at least two specific operating conditions of the charge pump, and charge-strength selector inputs which set a voltage ramp-up rate of the voltage output. The apparatus further comprises a soft-start control coupled to the charge-strength selector inputs of the charge pump and providing a binary series output. The binary series output results in the voltage output of the charge pump reaching the target voltage in a time period having a series of voltage ramp-up rate steps. The soft-start control includes a counter producing the binary series output, a programmable memory register for each of the at least two specific operating conditions of the charge pump and which selects a frequency of the binary series output, and a detection and selection circuit. The detection and selection circuit is adapted to detect the specific operating condition of the charge pump and select the correct the binary series output for the specific operating condition when the detection and selection circuit and the counter receive the charge-off signal output from the charge pump.

In yet another embodiment of the present invention, provided is a host system comprising a system bus for communicating information through the host system, a voltage supply providing voltage over the system bus, a processor for processing instructions coupled to the system bus, and main memory for temporarily storing the instructions and data for the processor. The main memory is coupled to the processor. The host system further includes read-only memory to store static information for the processor, the read-only memory is coupled to the system bus, an input device for accepting the instruction and data, the input device is coupled to the system bus, an output device couple to the system bus, and a flash memory device coupled to the system bus. The flash memory device comprises a charge pump providing a voltage output, a charge-off signal output when the voltage output is below a target voltage for at least two specific operating conditions of the charge pump, and charge-strength selector inputs which set a voltage ramp-up rate of the voltage output. A programmable soft-start control is coupled to the charge-strength selector inputs of the charge pump and provides a binary series output which results in the voltage output of the charge pump reaching the target voltage in a time period having a series of voltage ramp-up rate steps.

Other features and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements, and in which.

DETAILED DESCRIPTION OF THE PREFERRED EMBODIMENTS

A method and apparatus for providing a programmable soft-start control for a charge pump for use with a low voltage power supply is described. Although the following embodiment is described with references to flash memory, such as an ATA Flash card, Compact Flash card, PCMCIA card, or solid state mass storage hard drive, alternative embodiments are applicable to other types of circuits, including other types of nonvolatile memories, that may benefit from a finer soft-start control via firmware in order to add flexibility to applying specific soft-start setting according to turn-on conditions.

Figure 1:
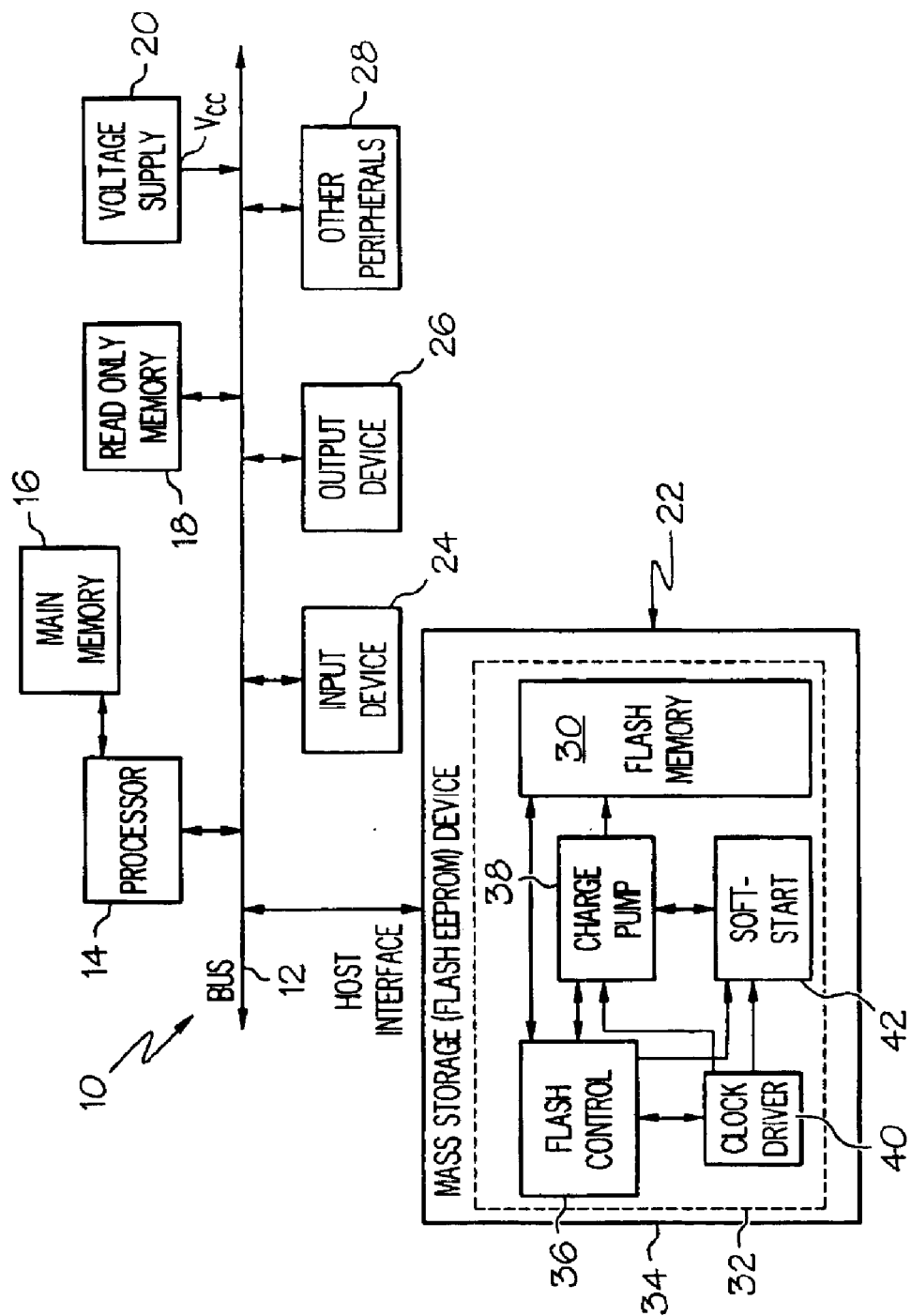
FIG. 1 is a block diagram of a computer system that may be advantageously used for one embodiment of the present invention.

FIG. 1 shows a block diagram of a host system 10 that may advantageously use the soft-start control of the present invention. The host system 10 includes a system bus 12 for communicating information between the various components of the host system 10. A processor 14 for processing instructions is coupled to the system bus 12. The processor 14 is a microprocessor for one embodiment, but a microcontroller, application specific integrated-circuit (ASIC) or other type of processor may be used for alternative embodiments. A main memory 16 for temporarily storing instructions and data for the processor 14 is coupled to the processor. The main memory 16 includes dynamic random access memory (DRAM), but may include a different type of memory for other embodiments.

Additionally coupled to the system bus 12 is a read-only memory 18 to store static information for the processor 14, a voltage supply 20 to provide the system supply voltage Vcc over the system bus 12, a flash memory device 22, an input device 24, such as a microphone, touch-screen, keyboard/keypad or a cursor control device, and an output device 26, such as a monitor, speaker, and/or a printer. The host system 10 may also include other peripheral components 28, such as a memory controller and/or a bus bridge device, for example.

The system supply voltage Vcc ranges from about 1.65 to about 5.5V, wherein the voltage range is a function of the voltage source, such as the battery type and the number of battery cells in use. Preferably, for one embodiment the voltage is about 3.3 volts and is provided by a low powered battery. For alternative embodiments, the supply voltage may be higher or lower and may be provided by another type of voltage source.

In the embodiment shown in FIG. 1, the flash memory device 22 is provided as a removable compact flash memory card for devices which use flash memory, for example, to store data, send and receive wireless faxes, store digital audio clips and digital images. In another embodiment, the flash memory device 22 may serve the same function as a conventional hard disk drive. In still another embodiment, the flash memory device 22 may be used to store computer applications, such as a BIOS firmware, printer fonts, or applications that are used in video game systems. Accordingly, in one embodiment the host system 10 is a computer system, such as a laptop, personal computer, or network system. In other embodiments, the host system 10 is a digital camera, a cellular telephone, an audio recorder, a personal digital assistant, test equipment, a video game system, and the like.

The flash memory device 22, when provided as a flash memory card, comprises flash memory 30 of a plurality of non-volatile, flash electrically erasable programmable read only memory (EEPROM) chips provided on a printed circuit board 32, encased in a rugged shell 34. The flash memory device 22 further comprises a flash control circuit 36 which provides full compatibility of the flash memory 30 to various standards such as, for example, Compact Flash, ATA, PCMCIA standards, and controls the interface logic of the flash memory device 22 to the host system 10. The flash memory device 22 further includes at least one charge pump circuit 38 for dc/dc conversion, a clock driver circuit 40 for providing circuit timing, via an oscillator or crystal, and a programmable soft start control circuit 42 according to the present invention. It is to be appreciated that all, or some of the above-mentioned circuits may be provided integrally within a single ASIC chip. For other embodiments, the flash memory device 22 may be configured in a different manner.

In the flash memory embodiment of FIG. 1, there are two operating conditions of the charge pump 38 where a slow start-up or soft-start should be applied to prevent circuit damage and to prolong component and battery life. One condition is the initial turn-on, where the voltage output (Vpump) of the charge pump 38 is charged from the input voltage Vcc to a step-up voltage, i.e., 7.0 v, under a no-current load state. The other condition is during flash programming, where the charge pump 38 is operating with a flash memory current load state. Because of the different current load states of the charge pump 38, it is preferably to have a longer voltage ramp-up rate (dv/dt) during the initial charge-up condition, and a shorter voltage ramp-up rate applied to the flash programming condition. For the other embodiments, other charge pump operational conditions may also be detected and controlled by the soft start method of the present invention.

Figure 2:
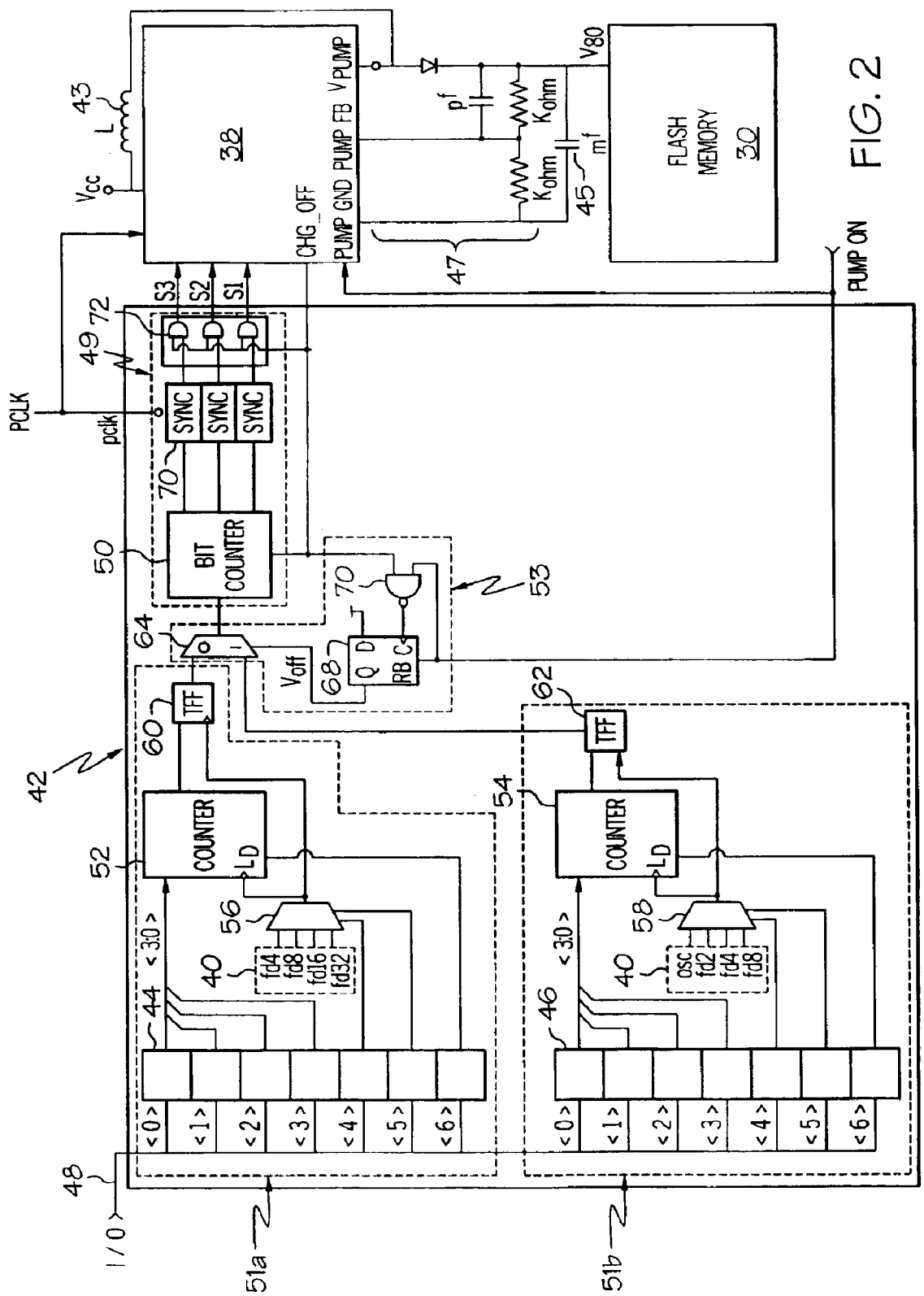
FIG. 2 is a block diagram showing a programmable soft-start control circuit for a high voltage charge pump.

As shown by FIG. 2, it is to be appreciated that although other charge pump arrangements may be used, preferably the charge pump 38 used with the programmable soft-start control 42 of the present invention provides a voltage output (Vpump), at least three charge-strength selector inputs S1, S2, and S3, a PFM clock input, a control signal input (PUMPON), and a charge-off signal output (CHG_OFF). For illustrative purposes, the voltage output (Vpump) is coupled to an inductive load, which is represented by inductor 43, a capacitive load, which is represented by capacitor 45, and the voltage input (V80) of the flash memory 30 in a conventional manner. The charge-strength selector inputs S1, S2, and S3 of the charge pump 38 are used to set a specific voltage ramp-up rate of the voltage output (Vpump). A conventional voltage divider circuit 47 may be used between the voltage output (Vpump) and the charge pump's ground (Pump_GND) in order to provide a feedback voltage input (PumpFB). The charge pump 38 will produce the charge-off signal output (CHG_OFF) when the detected feedback voltage is below an internal reference voltage of the charge pump 38, as is conventionally known.

To accommodate the previously mentioned soft-start conditions of the charge pump 38, the programmable soft-start control 42 provides a charging-series circuit 49, a pair of frequency selector circuits 51a and 51b, and a detection and selection circuit 53. The charging-series circuit 49 is coupled to the charge-off signal output (CHG_OFF) and the three charge-strength selector inputs S1, S2, and S3 of the charge pump 38. It is to be appreciated that because the charge-strength selector inputs S1, S2, and S3 set a specific voltage ramp-up rate of the voltage output (Vpump), turning-on different combinations of the charge-strength selector inputs S1, S2, and S3 at set time intervals over a period of time, in conjunction with a preset PFM clock, produce various voltage ramp-up rate steps. Accordingly, the soft-start control 42 controls both the selection combinations as a turn-on or charging-series output and the time period in which to complete the output series. In particular, the charging-series output is preferably a repeatable sequential binary series which results in the voltage output of the charge pump 38 reaching its full operational condition via a series of increasing voltage ramp-up rates steps over a period of time. The frequency at which the soft-start control 42 proceeds to the next steps in the charging-series is set by the digital logic programmed into the pair of selector circuits.

Each of the pair of the frequency selector circuits 51a and 51b provides a clock input to the charging-series circuit 49 for one of the soft-start conditions of the charge pump 38, wherein the pair of frequency selector circuits 51a and 51b is programmed by a user to select the frequency of the clock input. Furthermore, the detection and selection circuit 53 is coupled between the charging-series circuit 49 and the pair of frequency selector circuits 51a and 51b. The detection and selection circuit 53 is configured to detect the specific operating condition of the charge pump 38 and permit a pulse output from one of the pair of frequency selector circuits 51a or 51b to drive the clock input of the charging-series circuit 49 when the detection and selection circuit 53 and the charging-series circuit 49 receive the charge-off signal output (CHG_OFF) from the charge pump 38. A detailed discussion of each circuit 49, 51, and 53 of the soft-start control 42 now follows.

Starting with the pair of frequency selector circuits 51a, and 51b, each provides a control register 44 and 46, respectively. The control register 44 of the first frequency selector circuit 51a provides digital control to the selection of the frequency of the voltage ramp-up rate steps of the charge pump 38 during the initial charge-up condition, and hence the time period in which the series for this condition is completed. The control register 46 of the second frequency selector circuit provides digital control of the selection of the frequency of the voltage ramp-up rate steps of the charge pump 38 during the programming charge-up condition, and hence the time period in which the series for this condition is completed. Together, the control registers 44 and 46 add flexibility to the use of the charge pump 38 by permitting a user to apply specific time periods in which to complete a series of voltage ramp-up rates according to different charge pump soft-start (turn-on) conditions by programming the frequency for each condition.

The pair of the control registers 44 and 46 each provide 7-bits of programmable memory. For programming purposes, the register bits of each control register 44 and 46 are divided into 7-bit words which are each indicated by reference symbol <0> through <6>, as shown by FIG. 2. The 7-bit words of each control register 44 and 46 is programmable by a 7-bit parallel data bus 48 in a conventional manner. Accordingly, depending on each 7-bit word stored in each of the control registers 44 and 46, the frequency selector circuits 51a and 51b control the voltage ramp-up rate of the charge pump circuit 38 by generating an operating frequency digitally selected from an available generation range of divided down clocks from the on-chip oscillator.

For the soft start control embodiment of FIG. 2, preferably, the ramp-up stepping rate generation range controllable by the first control register 44 is from about 0.1 us to about 16 us, and the ramp-up stepping rate generation range controllable by the second control register 46 is from about 0.03 us to about 4 us. Additionally, preferably, the output of the charging-series circuit 49 is such to provide seven voltage ramp-up rate steps to the charge pump 38. For the other embodiments, other control register sizes, frequency ranges, and number of the voltage ramp-up rate steps may be used. Because the outputs of the charging-series 49 are controlled and selected by the digital logic programmed into one of the pair of registers 44 or 46 for each soft-start condition, the detection and selection circuit 53 is provided to detect the above-mentioned two soft-start conditions and automatically switch over to the correct pre-programmed operating frequency of the charging-series circuit 49, as will be explained hereafter.

Within the pair of frequency selector circuits 51a and 51b, each of the control registers 44 and 46 are coupled to a programmable divide-by-n counter/prescaler 52 and 54, respectively, and a four-to-one multiplexer 56 and 58, respectively. In particular, bits <0>, <1>, <2>, and <3> of each control register 44 and 46 are coupled to the data inputs of the programmable divide-by-N counter 50 and 52, respectively. Bits <4> and <5> of each control register 44 and 46 control the output selection of the respective four-to-one multiplexers 56 and 58, wherein each multiplexer receives four clock-frequencies inputs (fdn). The four clock-frequencies inputs are frequency divisions (n) of a clock frequency provided by either the clock driver circuit 40, see also FIG. 1, or, if desired, an embedded oscillator. For the embodiment of FIG. 2, the frequency divisions (n) of the inputted clock frequencies (fdn) to the multiplexer 56 coupled to the first control register 44, is preferably n=4, 8, 16, and 32, where fdn=clock frequency/n. Additionally, preferably, the frequency divisions (n) inputted to the multiplexer 58 coupled to the second control registered 46 is n=1, 2, 4, 8, where fdn=clock frequency/n. For the other embodiments, different number of inputted frequencies and frequency divisions may be selected.

Register bit <6> of each control register 44 and 46 is used to load-enable the respective counter/prescaler 52 and 54 in the soft start circuit 42 with the contents of bits <0> thru <3>. Bits <0> thru <3> determine the value of the programmable divider, which may further divide the input frequency from the respective four-to-one multiplexer 56 and 58. For the embodiment of FIG. 2, the preferred range of the divisor values is from 0 to 15. For the other embodiments, the range of the divisor values may be different.

The output of each four-channel multiplexer 56 and 58, in addition to being coupled to the clock input of the respective counter 52 and 54, is also coupled to the clock input of a respective T flip-flop 60 and 62. The output of each T flip-flop 60 and 62 is coupled to a two-to-one multiplexer 64 of the detection and selection circuit 53. Because the output of each T flip-flops 58 and 60 toggles with each clock pulse, the output of the two-to-one multiplexer 62 in the detection and selection circuit 53 will be a frequency division output of the counter/prescaler 52 or 54 from one of the frequency selector circuits 51a or 51b. The selection of which frequency selector circuit 51a or 51b is used to drive the clock input of the charging-series circuit 49, and hence to set the rate of charge strength increments at which each voltage ramp-up rate step in the charging-series is carried out, is determined by the detection and selection circuit 53.

As previously mentioned above, the detection and selection circuit 53 detects the soft-start condition, either initial start-up or flash programming, of the charge pump 38, and automatically switches the output of its two-to-on multiplexer 64 to the correct pre-programmed frequency for a clock pulse output of one the frequency selector circuits 51a or 51b. This detection is accomplished by the detection and selection circuit 53 receiving two signals external to the soft-start circuit 42, the charge-off signal (CHG_OFF) of the charge pump and a pump turn-on signal, which is indicated as PUMPON by FIG. 2. As mentioned previously, the charge-off signal from the charge pump circuit 38 is set high whenever the voltage output drops below a reference value, signaling the need for the charge pump to turn on. The pump turn-on signal (PUMPON) is received from the host system 10 (FIG. 1) and is set high whenever the system is turned-off or placed in a stand-by condition. A discussion on how these signals are used by the detection and selection circuit 53 now follows.

The detection and selection circuit 53, in addition to the two-to-one multiplexer 64, further includes a D-type flip-flop 68 and a NAND gate 70. The NAND gate 70 receives both the CHG_OFF and PUMPON signals. The output of the NAND gate is coupled to the clock input C of the flip-flop 68. Accordingly, the clock input C of the flip-flop 68 will receive a high signal each time the CHG_OFF signal is low and the PUMPON signal is high. Accordingly, because the D input is always set high, the output Q of the flip-flop, once set on the received clock pulse, will also be high, thereby setting the two-to-one multiplexer 64 to output the clock pulse set at the operating frequency for the charge pump's flash programming condition, which is preprogrammed by the control register 46 of the second frequency selector circuit 51b. However, whenever the CHG_OFF and PUMPON signals are high, the clock input C of the flip-flop 68 receives a low signal from the NAND gate. Because an asynchronous clear RB of the flip-flop 68 also received the PUMPON signal (which is NOT'ed since active low), the output Q of the flip-flop 68 is immediately reset to low. Resetting the output Q to low, switches the output of the two-to-one multiplexer 64 to the clock pulse set at the operating frequency of the charge pump's initial start-up condition, which is preprogrammed by the control register 44 of the first frequency selector circuit 51a. Accordingly, the detection and selection circuit 53 will switch the multiplexer 64 between the two clock pulses of different operating frequencies depending on the state of the signals it received.

The clock pulse output of the two-to-one multiplexer 64 of the detection and selection circuit 53 drives the clock input of a bit counter 50 of the charging-series circuit 49. As shown by FIG. 2, the charging-series circuit 49 further includes a set of synchronous gates 70 and a set of AND gates 72. For this embodiment, preferably the bit counter 50 is a 3-bit binary up-counter that transitions through the sequence 001, 010, 011, 100, 101, 110, 111, and repeats. For the other embodiments other types of counters, such as n-bit counter may be used.

Because of pulse delays, the set of synchronous gates 70, which receives a preprogramed pump clock that is used for timing of the charge and discharge phase of charge-pump components, ensures that the output signals of the bit counter 50 do not show a transient and incorrect result for a given time period. Accordingly, due to the set of synchronous gates 70 the outputs of the bit counter 50 will change the states of the charge-strength selector inputs S1, S2, and S3 of the charging pump 38 at essentially those instances when PCLK is at a low state, thereby safeguarding against any signal glitches on the selector inputs. Additionally, because of the set of AND gates 72, each synchronized output of the bit counter 50 is inputted to its respective charge-strength selector input S1, S2, or S3 of the charge pump 38, only if the output of the respective synchronous gate 70 is high and the received CHG_OFF signal from the charge pump 38 is also high.

The CHG_OFF signal from the charge pump 38 is also coupled to the reset input of the bit counter 50, and therefore when the CHG_OFF signal goes low, the bit counter 50 is reset to its default state. As such, when the charge pump 38 is turned-on due to a detected soft-start condition, initially all the charge-strength selector inputs S1, S2, and S3 are at the default state of 001 due to the counter being set to low. Accordingly, while the CHG_OFF signal remains high, indicating the voltage output (Vpump) is not at the target voltage, charge-strength selector inputs S1, S2, and S3 will then each go high sequentially according to the output of the bit counter 50. In a preferred use of the soft-start control 43, each output of the bit counter 50 of the charging-series circuit 49 turns on a gate leg of an output transistor (not shown) of the charge pump 38 thus increasing the output driving strength during the charge phase. Accordingly, as each selector input S1, S2, and S3 of the charge pump 38 goes high, greater pulldown strength is applied to the voltage output (Vpump) of the charge pump 38.

In particular, for the embodiment of FIG. 2, preferably the turn-on sequence of the selector input S1, S3, and S3 provided by the output from the bit counter 50 of the charging-series circuit 49 results in a sequential increase of voltage pulldown strength of the charge pump 38. The relationship between the selector input turn-on sequence and voltage pulldown strength is shown by Table 1.

TABLE 1

| Selector Input Turn-On Sequence | | | |
|---|---|---|---|
| S3 | S2 | S1 | Pulldown Strength |
| 0 | 0 | 1 | 2x |
| 0 | 1 | 0 | 4x |
| 0 | 1 | 1 | 6x |
| 1 | 0 | 0 | 8x |
| 1 | 0 | 1 | 10x |
| 1 | 1 | 0 | 12x |
| 1 | 1 | 1 | 14x |

Accordingly, the soft-start control 42, with the pair of frequency selector circuits 51a and 51b, replaces the controlled, quick voltage ramp-up rate of a conventional timing capacitor with a digitally controlled charging-series of voltage ramp-up rate steps, each providing an increasing charge current. Because the pair of control registers 44 and 46 of the frequency selector circuits 51a and 51b can be programmed by a user to determine the frequency of the charging-series for each specific charge pump operating condition, the soft-start control 42 permits a user to digitally change conveniently and economically the time period in which the charge pump 38 reaches normal operation without the need for a circuit redesign.

In the foregoing specification, the invention has been described with reference to specific exemplary embodiments thereof. It will, however be appreciated that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A programmable soft-start control for a charge pump comprising at least one programmable register for controlling charging duration of the charge pump, the charging duration being changeable with an n-bit word receivable by said at least one programmable register via a bus, the charge pump being charged in a series of discrete ramp steps which provide increasing charge current during each discrete ramp step.

2. A programmable soft-start control as claimed in claim 1, wherein duration of said each discrete ramp step is set by writing a setting to said at least one programmable register.

3. A programmable soft-start control as claimed in claim 1, wherein duration of said each discrete ramp step is programmed by writing a setting to said at least one programmable register, and wherein duration of said each discrete ramp step is uniform.

4. A programmable soft-start control as claimed in claim 1, wherein duration of said each discrete ramp step is programmed by writing a setting to said at least one programmable register, and wherein said duration is in the range of about 0.03 $\mu$s to about 16 $\mu$s.

5. A programmable soft-start control as claimed in claim 1, wherein said at least one programmable register is a pair of programmable registers.

6. A programmable soft-start control as claimed in claim 1, wherein said at least one programmable register is a pair of programmable registers each assigned a distinct turn-on condition of the charge pump.

7. A programmable soft-start control as claimed in claim 1, wherein said at least one programmable register is a pair of programmable registers each assigned a distinct turn-on condition of the charge pump selected from initial power up and flash programming.

8. A programmable soft-start control as claimed in claim 1, further comprising feed back logic, wherein said at least one programmable register is a pair of programmable registers each assigned a distinct turn-on condition of the charge pump selected from initial power up and flash programming, each of said programmable registers being programmable with a setting controlling the charging duration of the charge pump, and wherein said feedback logic is adapted to detect the turn-on condition of the charge pump and select the assigned programmable register.

9. A programmable soft-start control as claimed in claim 1, wherein duration of said each discrete ramp step is programmed by writing a setting to said at least one programmable register, and wherein said at least one programmable register is a pair of programmable registers each providing a different setting for the duration of said each discrete ramp step.

10. A programmable soft-start control as claimed in claim 1, wherein duration of said each discrete ramp step is programmed by writing a setting to said at least one programmable register, wherein said at least one programmable register is a pair of programmable registers each providing a different setting for the duration of said each discrete ramp step, and wherein one of said pair of programmable registers has a setting providing a duration of said each discrete ramp step in the range of about 0.03 $\mu$s to about 4 $\mu$s, and the other has a setting providing a duration of said each discrete ramp step in the range of about 0.1 $\mu$s to 16 $\mu$s.

11. A programmable soft-start control as claimed in claim 1, wherein for an initial power up condition, said soft-start control is programmed to charge the charge pump from about 3.3V to about 7.0V within about 100$\mu$s at about 2.2 $\mu$F load and no current load.

12. A programmable soft-start control as claimed in claim 1, wherein for a flash programming condition, said soft-start control is programmed with instructions to turn on a current load of about 45 mA for about 10 $\mu$s and turn off said current load for about 0.5 $\mu$s, and repeat said instructions at least six times.

13. A programmable soft-start control for a charge pump comprising:

a first programmable register assigned to an initial power up condition of the charge pump, the charge pump being charged in a series of discrete ramp steps which provide increasing charge current during each discrete ramp step, said first programmable register is programmed with a first setting controlling duration of each discrete ramp step;

a second programmable register assigned to a flash programming condition of the charge pump, and programmed with a second setting controlling duration of each discrete ramp step; and feed back logic adapted to detect said turn-on condition of the charge pump and select the assigned programmable register, each said programmable registers providing a different charging duration, wherein said charging duration for said programmable register assigned to said initial power up is longer than said charging duration for said programmable register assigned to said flash programming.

14. A programmable soft-start control as claimed in claim 13, wherein said first setting results in the soft-start control providing a ramp step duration in the range of about 0.03 μs to about 4 μs, and said second setting providing a ramp step duration in the range of about 0.1 μs to 16 μs.

15. A programmable soft-start control as claimed in claim 13, wherein for said initial power up, said soft-start control is programmed with instructions to charge the charge pump from about 3.3V to about 7.0V within about 100 μs at about 2.2 μF load and no current load.

16. A programmable soft-start control as claimed in claim 13, wherein for said flash programming, said soft-start control is programmed with instructions to turn on a current load of about 45 mA for about 10 μs and turn off said current load for about 0.5 μs, and repeat said instructions at least six times.

17. A programmable soft-start control for a charge pump configured to provide a voltage output, a charge-off signal output when the voltage output is below a target voltage, a programmable clock input to provide PFM control of charge and discharge phases of the charge pump, and charge-strength selector inputs which set a voltage ramp-up rate of the voltage output.

18. A programmable soft-start control as claimed in claim 17, further comprising a charging-series circuit coupled to the charge-off signal output and the charge-strength selector inputs of the charge pump, said charging-series circuit is configured to provide turn-on outputs to the charge-strength selector inputs.

19. A programmable soft-start control as claimed in claim 17, further comprising at least one frequency selector circuit configured to provide a clock pulse output used by a charging-series circuit for a soft-start condition of the charge pump.

20. A programmable soft-start control as claimed in claim 17, further comprising a detection and selection circuit coupled between a charging-series circuit and at least one frequency selector circuit, said detection and selection circuit is configured to detect a soft-start condition of the charge pump and select, for said soft-start condition, a clock pulse output of said at least one frequency selector circuit to clock said charging-series circuit when said detection and selection circuit and said charging-series circuit receive the charge-off signal output from the charge pump.

21. A programmable soft-start control as claimed in claim 17, further comprising a charging-series circuit coupled to the charge-off signal output and the charge-strength selector inputs of the charge pump, said charging-series circuit is configured to provide turn-on outputs to the charge-strength selector inputs, wherein said charging-series circuit comprises a counter configured to provide a repeatable step series of turn-on outputs to the charge-strength selector inputs of the charge pump.

22. A programmable soft-start control as claimed in claim 17, further comprising a charging-series circuit coupled to the charge-off signal output and the charge-strength selector inputs of the charge pump, said charging-series circuit is configured to provide turn-on outputs to the charge-strength selector inputs, wherein each of said turn-on outputs is coupled to a respective synchronous gate, and each said respective synchronous gate is coupled to a respective AND gate, and wherein said charging-series circuit is configured to provide each of said turn-on outputs to the charge pump when said respective AND gate receives the charge-off signal output from the charge pump and an output from said respective synchronous gate.

23. A programmable soft-start control as claimed in claim 19, wherein said at least one frequency selector circuit comprises a programmable memory register configured to provide digital logic that selects said frequency of said clock pulse output.

24. A programmable soft-start control as claimed in claim 19, wherein said at least one frequency selector circuit comprises a divide-by-n counter/prescaler having data inputs coupled to a programmable memory register which set a frequency division of said divide-by-n counter/prescaler, said divide-by-n counter/prescaler is configured to provide said clock pulse output.

25. A programmable soft-start control as claimed in claim 19, wherein said at least one frequency selector circuit further comprises a T flip-flop and a multiplexer coupled to clock inputs of both a divide-by-n counter/prescaler and said T flip-flop, said T flip-flop is configured to receive a clock pulse output of said divide-by-n counter/prescaler and is configured to output said clock pulse output on a clock pulse from said multiplexer.

26. A programmable soft-start control as claimed in claim 19, wherein said at least one frequency selector circuit comprises two frequency selector circuits, each of said two frequency selector circuits is configured to provide a clock pulse output for a specific soft-start condition of the charge pump.

27. A programmable soft-start control as claimed in claim 20, wherein said detection and selection circuit comprises a two-to-one multiplexer, and a D flip-flop configured to receive the charge-off signal output of the charge pump and an external pump turn-on signal in order to correctly switch said two-to-one multiplexer to said clock pulse output of said frequency selection circuit for a specific soft-start condition.

28. A method for controlling a voltage ramp-up rate of a charge pump configured to provide an output voltage under specific soft-start conditions, the charge pump having charge-strength selector inputs that set a voltage ramp-up rate of the output voltage, the method comprising programming at least one memory register to set both a divisor for a divide-by-n counter/prescaler and a clock signal input for a specific soft-start condition of the charge pump.

29. A method as claimed in claim 28 further comprises producing a clock signal pulse of a specific frequency based on digital logic stored in said at least one memory register.

30. A method as claimed in claim 28 further comprises producing a clock signal pulse of a specific frequency based on digital logic stored in said at least one memory register, and driving a charging-series output with said clock signal pulse at said specific frequency.

31. A method as claimed in claim 28 further comprises driving a charging-series output with a clock signal pulse at a specific frequency, and providing a charging-series output to the charge-strength selector inputs of the charge pump to vary the voltage ramp-up rate of the output voltage of the charge pump for each of the specific soft-start condition.

32. A method as claimed in claim 28, wherein said at least one memory register comprises two memory registers and said method further comprises detecting said specific soft-start condition of the charge pump and providing a clock signal pulse produced according to digital logic of one of said two memory registers for the specific soft-start condition.

* * * * *

UNITED STATES PATENT AND TRADEMARK OFFICE
CERTIFICATE OF CORRECTION

PATENT NO. : 6,934,187 B2
APPLICATION NO. : 10/868306
DATED : August 23, 2005
INVENTOR(S) : Paul Cheung It is certified that error appears in the above-identified patent and that said Letters Patent is hereby corrected as shown below:

Col. 9, Line 5, "S3 and S3" should read --S2 and S3

Col. 9, Line 27, "controlled," should read --uncontrolled,--

Signed and Sealed this

Eighteenth Day of July, 2006

JON W. DUDAS
*Director of the United States Patent and Trademark Office*